United States Patent
Hu et al.

(10) Patent No.: US 7,141,455 B2
(45) Date of Patent: Nov. 28, 2006

(54) METHOD TO MANUFACTURE LDMOS TRANSISTORS WITH IMPROVED THRESHOLD VOLTAGE CONTROL

(75) Inventors: Binghua Hu, Plano, TX (US); Howard S. Lee, Plano, TX (US); Henry L. Edwards, Garland, TX (US); John Lin, Chelmsford, MA (US); Vladimir N. Bolkhovsky, Framingham, MA (US)

(73) Assignee: Texas Instruments Incorporated, Dallas, TX (US)

( * ) Notice: Subject to any disclaimer, the term of this patent is extended or adjusted under 35 U.S.C. 154(b) by 162 days.

(21) Appl. No.: 10/712,455

(22) Filed: Nov. 12, 2003

(65) Prior Publication Data

US 2004/0106236 A1    Jun. 3, 2004

Related U.S. Application Data

(60) Provisional application No. 60/428,821, filed on Nov. 25, 2002.

(51) Int. Cl.
*H01L 21/332* (2006.01)
(52) U.S. Cl. .................. 438/135; 438/306; 438/305
(58) Field of Classification Search ............. 438/135, 438/306, 305, 217, 231
See application file for complete search history.

(56) References Cited

U.S. PATENT DOCUMENTS

| | | | |
|---|---|---|---|
| 5,821,146 A * | 10/1998 | Chang et al. ............. 438/299 |
| 5,869,371 A * | 2/1999 | Blanchard ................. 438/268 |
| 5,930,634 A * | 7/1999 | Hause et al. ............. 438/307 |
| 6,153,455 A * | 11/2000 | Ling et al. ................ 438/231 |
| 6,162,689 A * | 12/2000 | Kepler et al. ............. 438/299 |
| 6,274,443 B1 * | 8/2001 | Yu et al. ................... 438/299 |
| 6,287,922 B1 * | 9/2001 | Yu et al. ................... 438/299 |
| 6,436,776 B1 * | 8/2002 | Nakayama et al. ........ 438/305 |
| 6,479,350 B1 * | 11/2002 | Ling et al. ................ 438/265 |
| 6,551,870 B1 * | 4/2003 | Ling et al. ................ 438/217 |
| 6,624,034 B1 * | 9/2003 | Abe et al. ................. 438/300 |
| 6,878,599 B1 * | 4/2005 | Inaba ....................... 438/305 |
| 7,052,963 B1 * | 5/2006 | Williams et al. .......... 438/268 |
| 2003/0040159 A1 * | 2/2003 | Sasaki ...................... 438/286 |
| 2003/0232475 A1 * | 12/2003 | Sasaki ...................... 438/303 |
| 2004/0079991 A1 * | 4/2004 | Lin et al. .................. 257/335 |
| 2004/0106236 A1 * | 6/2004 | Hu et al. ................... 438/135 |
| 2005/0009284 A1 * | 1/2005 | Inaba ....................... 438/305 |

* cited by examiner

*Primary Examiner*—Laura M. Schillinger
(74) *Attorney, Agent, or Firm*—Peter M. McLarty; W. James Brady, III; Frederick J. Telecky, Jr.

(57) ABSTRACT

A double diffused region (65), (75), (85) is formed in an epitaxial layer (20). The double diffused region is formed by first implanting light implant specie such as boron through an opening in a photoresist layer prior to a hard bake process. Subsequent to a hard bake process heavy implant specie such as arsenic can be implanted into the epitaxial layer. During subsequent processing such as LOCOS formation the double diffused region is formed. A dielectric layer (120) is formed on the epitaxial layer (20) and gate structures (130), (135) are formed over the dielectric layer (120).

7 Claims, 1 Drawing Sheet

METHOD TO MANUFACTURE LDMOS TRANSISTORS WITH IMPROVED THRESHOLD VOLTAGE CONTROL

This application claims priority under 35 USC § 119(e)(1) of provisional application Ser. No. 60/428,821, filed Nov. 25, 2002.

FIELD OF THE INVENTION

The present invention relates to a method for forming a lateral double diffused metal oxide semiconductor transistor using multiple ion implantation processes.

BACKGROUND OF THE INVENTION

Lateral double-diffused metal oxide semiconductor (LDMOS) transistors are used in integrated circuits for high voltage applications. High voltage applications require that the LDMOS transistors have a low on resistance, a high off resistance, and a large electrical safe operating area. To increase the current handling capability of the LDMOS transistors on an integrated circuit a number of LDMOS transistors are often tied together. With the LDMOS transistors connected in parallel the current flow will be shared among the various LDMOS transistors. One scheme for forming multiple LDMOS transistors involves forming a multi-fingered structure. To ensure the proper distribution of current among the transistors in a multi-fingered structure it is important that the threshold voltages of the individual LDMOS transistor structures be closely matched. The threshold voltage of the LDMOS transistor is set by the multiple ion implantation processes used to form the transistor channel region. During this multiple ion implantation process a patterned photoresist masking layer is formed over the substrate and the dopant species implanted through patterned openings formed in the photoresist masking layer. In forming the multi-fingered LDMOS transistors required for high current applications a major limitation to obtaining closely matched threshold voltages is the variation in the resist angle of the various openings through which the dopants are implanted. The instant invention is a method for forming multi-fingered LDMOS transistors with closely matched threshold voltages.

SUMMARY OF INVENTION

The instant invention is a method for forming a LDMOS with improved threshold voltage. The improvement in the threshold comes from a tightly controlled double diffused junction formation process. In particular the method comprises forming an epitaxial layer on a semiconductor substrate. A deep n-well region is formed in the epitaxial region in which the LDMOS transistor will be formed. The double diffused region is formed by first forming a patterned photoresist layer over the deep n-well region with the patterned photoresist layer comprises at least one opening. Light implant specie such as boron is implanted into the deep n-well region. A hard bake process is then performed and heavy implant specie such as arsenic is then implanted through the opening and into the deep n-well region. During the subsequent formation of the LOCOS isolation structures in the deep n-well region the heavy and light implant specie will diffuse at different rates resulting in the formation of the double diffused region. A dielectric layer is then formed on the epitaxial layer and a LDMOS transistor gate structure formed on the dielectric layer. Drain regions are then formed in the epitaxial layer to complete the LDMOS transistor formation. In an embodiment of the instant invention the hard bake process comprises heating said patterned photoresist layer to temperatures between 75° C. and 200° C. In a further embodiment of the instant invention forming the LOCOS isolation structures comprises performing thermal oxidation processes at temperatures greater than 800° C.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1A:
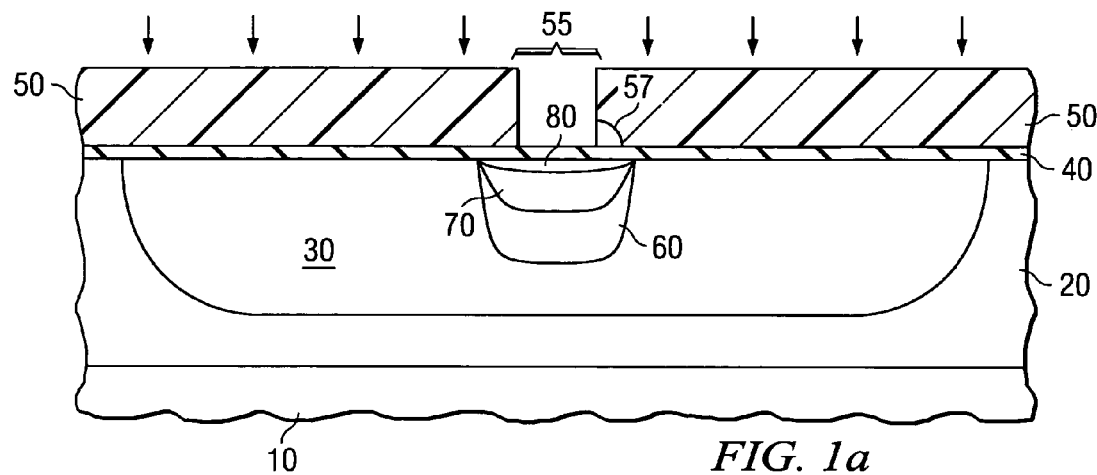
FIGS. 1(a)–1(c) are cross-sectional diagrams showing an embodiment of the instant invention.

Referring to FIG. 1(a) an epitaxial layer 20 is formed on a semiconductor substrate 10. The epitaxial layer 20 can be formed using known semiconductor manufacturing methods. The formation of an epitaxial layer on a semiconductor substrate is optional and the method of the instant invention can be used to form devices on any suitable semiconductor substrate. Following the formation of the epitaxial layer, a pad oxide layer 40 is formed on the epitaxial layer 20. The pad oxide layer 40 is necessary to reduce the damage caused by the subsequent implantation processes. For the case where no epitaxial layer is formed the pad oxide layer will be formed on the surface of the semiconductor substrate 10.

In an embodiment where an epitaxial layer 20 is formed an oppositely doped deep well region 30 is formed in the epitaxial layer 30. For the case where the epitaxial layer 20 is p-type the deep well region 30 will be n-type. Similarly an n-type epitaxial layer 20 will require the formation of a p-type deep well region 30. In a preferred embodiment an n-type deep well region is formed in a p-type epitaxial layer or a p-type semiconductor substrate. Following the formation of the deep n-well region a patterned photoresist layer 50 is formed over the pad oxide layer 40. To effectively mask the dopant species that will be subsequently implanted into the deep well region the patterned photoresist layer will be on the order of 1.8 μm to 4 μm thick. In a preferred embodiment the photoresist layer 50 will be 2 μm to 3 μm thick. Illustrated in FIG. 1(a) is a patterned photoresist layer 50 with a single opening that will be used to form a LDMOS transistor with a single finger. The method of the instant invention should not be limited to photoresist layers with a single opening. If LDMOS transistors with multiple fingers are required then the deep n-well region 30 and patterned photoresist layer 50 shown in FIG. 1(a) can be repeated multiple times along a line in the epitaxial layer 20.

In forming the patterned photoresist layer 50 a blanket layer of photoresist is first formed. In an embodiment of the instant invention the photoresist layer is formed using Sumitomo PFI-37 photoresist. Following the formation of the blanket layer of photoresist, and before the exposure process, a soft bake of the photoresist is performed. In an embodiment the soft bake process comprises a 75° C. to 160° C. heat treatment of the blanket layer of photoresist for 60 to 200 seconds. Following the soft bake process the blanket layer of photoresist is exposed. Following exposure a post exposure bake can be performed and in an embodiment the post exposure bake comprises annealing the photoresist layer at temperatures between 60° C. to 210° C. Following the post exposure bake process the photoresist layer is developed to form the opening 55 shown in FIG. 1(a). Boron species are then implanted through the opening 55 and into the deep well region 30 using multiple ion implantation processes to form the p-type regions 60 and 70 in the deep well region 30 as shown in FIG. 1(a). In a preferred embodiment the deep p-type region 60 can be formed by implanting a boron containing species at energies of 300 KeV to 500 Kev and doses of $5 \times 10^{13}$ cm$^{-2}$ to $5 \times 10^{14}$ cm$^{-2}$. The shallower p-type region 70 can also be formed by implanting a boron containing species but at reduced energies of 40 KeV to 60 KeV and doses of $5 \times 10^{12}$ cm$^{-2}$ to $5 \times 10^{13}$ cm$^{-2}$. The multiple ion implantations of the boron species used to form regions 60 and 70 can be performed in the same implant tool in a continuous sequence or chain process. Following the implantation of the boron containing species used to form p-type regions 60 and 70 and prior to the implantation of the arsenic species that will be used to form the n-type region 80, a hard bake process is applied to the patterned photoresist layer 50. In general a hard bake process comprises thermally annealing the patterned photoresist layer 50. In a preferred embodiment the hard bake process comprises heating the patterned resist layer 50 to temperatures of 75° C. to 200° C. for 60 to 200 seconds. The hard bake process improves the stability of the patterned photoresist layer 50 to effectively withstand the high power and damage of the arsenic implant. Following the hard bake of the patterned photoresist layer 50, arsenic species are implanted through the opening 55 to form the n-type region 80. It should be noted that performing the hard bake process after the multiple boron implantation processes is an important aspect of the instant invention. During the hard bake process the angle 57 that the edge of the patterned photoresist layer 50 makes with the surface pad oxide layer 40 is reduced. The reduction in the angle 57 leads to penetration of high-energy boron species (i.e. from the 300 KeV to 500 KeV implant process) into masked regions of the deep well region 30 beneath the patterned photoresist layer 50. Because the change in the angle 57 is different across the different fingers for LDMOS transistors with multiple fingers, large variations in LDMOS threshold voltages will result. It is important therefore that the p-type regions 60 and 70 be formed by implanting high-energy boron species before any photoresist hard bake process is performed. In addition to boron any light mass implant specie can be implanted before any hard bake photoresist process is performed. Here light mass specie refers to elements in the periodic table below the element silicon. Following a photoresist hard bake process any heavy implant specie can be implanted using the hard baked photoresist as a mask. Here heavy implant specie refers to elements in the periodic table above the element silicon.

Figure 1B:
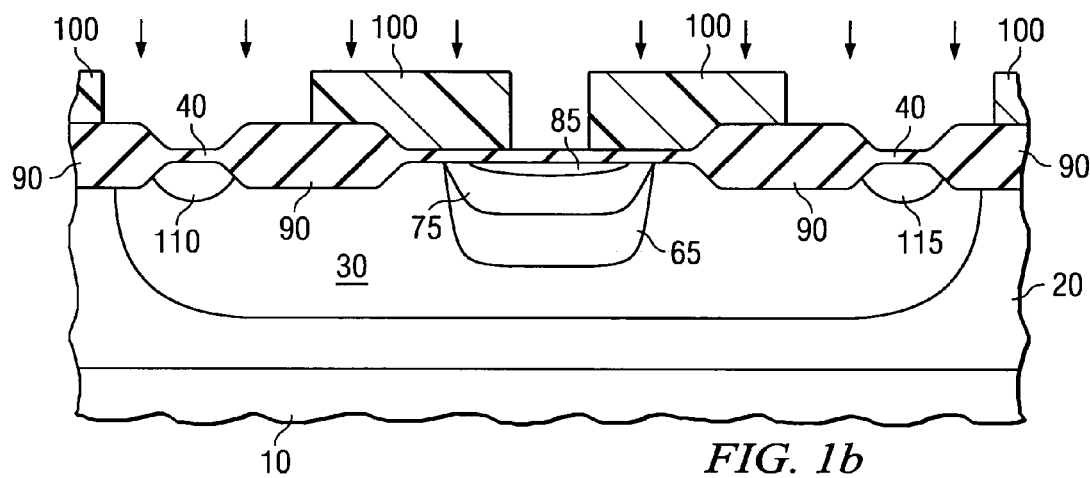

Following the multiple ion implantation processes the isolation regions 90 are formed as shown in FIG. 1(b). In a preferred embodiment local oxide isolation structures (LOCOS) are formed by first forming patterned silicon nitride layers on the pad oxide 40 (following the removal of the patterned photoresist layer 50 and any addition processes). The patterned silicon nitride layers are formed in those areas where no LOCOS isolation structures 90 are desired. Following the formation of the patterned silicon nitride layers, the LOCOS structures 90 are formed using thermal oxidation. The patterned silicon nitride layers will block the oxidation process in those regions of the epitaxial layer 20 that underlie the layers. The thermal oxidation process used to form the LOCOS structures 90 takes place at temperatures above 800° C. During the LOCOS thermal oxidation process the implanted boron and arsenic species will diffuse forming the double diffused regions 65, 75, and 85 shown in FIG. 1(b). The boron species have a temperature dependent intrinsic diffusivity constant that is almost an order of magnitude greater than that of the arsenic species and so the lateral diffusion of the boron species that occurs during the LOCOS oxidation process will be greater than that of the arsenic species. The difference in lateral diffusion of the boron and arsenic species that occurs during LOCOS oxidation results in the formation of the double diffused regions 65, 75, and 85. It should be noted that in the embodiment described above the thermal annealing required to form the double diffused regions 65, 75, and 85 occur during the LOCOS formation process. However in other embodiments of the instant invention an independent thermal annealing cycle (or cycles) could be utilized to form the double diffused regions 65, 75, and 85. In such an embodiment the temperature of the thermal annealing cycle (or cycles) should be between 800° C. and 1200° C. In the final LDMOS structure the n-type diffused region 85 will form the source of the transistor and the inversion channel of the transistor will be formed in the p-type diffused regions 65 and 75.

Following the formation of the silicon oxide isolation structures 90 and the double diffused regions 65, 75, and 85, a patterned photoresist layer 100 is formed and used as an ion implantation mask during the implantation of suitable n-type dopant species to form the n-type regions 110 and 115 that function as the drain regions of the LDMOS transistor. During this implantation process n-type dopant species are also implanted into the source region 85 to further increase the n-doping concentration.

Figure 1C:
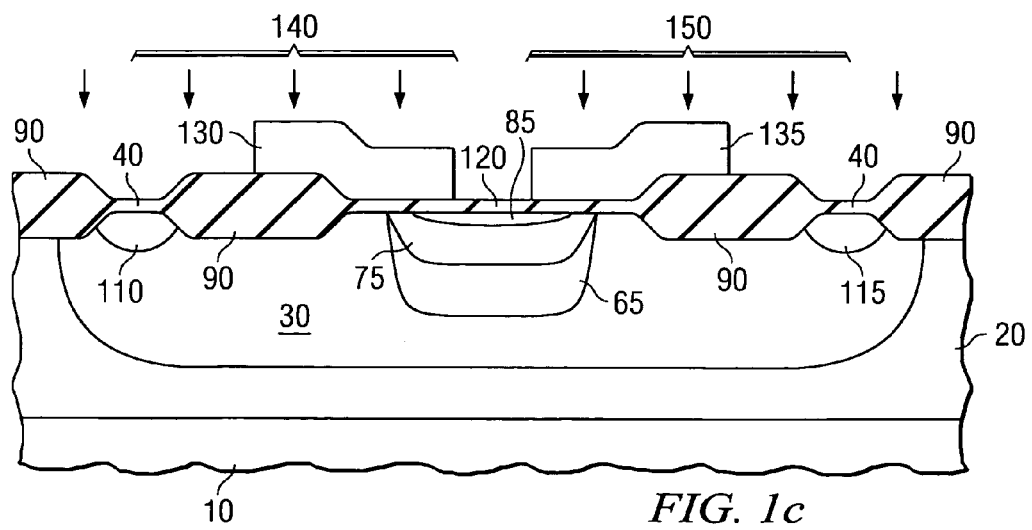

As shown in FIG. 1(c) a gate dielectric layer 120 is formed above the double diffused regions 65, 75, and 85. In a preferred embodiment the gate dielectric layer comprises silicon oxide but nitrogen containing silicon oxide materials can also be used to form the dielectric layer 120. The doped polysilicon structures 130 and 135 can be formed using known processing methods and function as the gate electrodes for the LDMOS transistors 140 and 150 respectively. Therefore the single finger structure illustrated in FIG. 1(c) results in the formation of two LDMOS transistors 140 and 150. The LDMOS transistors 140 and 150 share a common source region 85. The LDMOS transistor 140 also comprises the gate electrode region 130 and the drain region 110. Similarly in addition to the common source region 85 the LDMOS transistor 150 also comprises the gate electrode 135 and the drain region 115.

Thus while this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a LDMOS transistor, comprising:
   forming an epitaxial layer on a semiconductor substrate;
   forming a deep n-well region in said epitaxial layer;
   forming a patterned photoresist layer over said deep n-well region wherein said patterned photoresist layer comprises at least one opening;
   implanting a boron species into said deep n-well through said opening;

performing a hard bake process on said patterned photoresist layer;

implanting an arsenic species into said deep n-well through said opening;

forming LOCOS isolation structures in said deep n-well region; and forming a gate dielectric layer on said deep n-well region.

2. The method of claim 1 wherein said hard bake process comprises heating said patterned photoresist layer to temperatures between 75° C. and 200° C.

3. The method of claim 2 wherein forming said LOCOS isolation structures comprises performing thermal oxidation processes at temperatures greater than 800° C.

4. The method of claim 1 wherein implanting the boron species into said deep n-well through said opening comprises implanting the boron species at two or more implantation energies and dose levels through said opening.

5. The method of claim 1 wherein the hard bake process on said patterned photoresist layer is performed after implanting the boron species into the deep n-well region.

6. The method of claim 1 wherein the implanting of the arsenic species into the deep n-well is performed after the hard bake into said deep n-well through said opening.

7. The method of claim 1 wherein the forming of the LOCOS isolation structures in said deep n-well region is performed after implanting the arsenic species into a source region in the deep n-well.

* * * * *